(12) United States Patent
Kim

(10) Patent No.: US 7,528,033 B2
(45) Date of Patent: May 5, 2009

(54) SEMICONDUCTOR DEVICE WITH A DUMMY GATE AND A METHOD OF MANUFACTURING A SEMICONDUCTOR DEVICE WITH A DUMMY GATE

(75) Inventor: Dae Kyeun Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/563,394

(22) Filed: Nov. 27, 2006

(65) Prior Publication Data

US 2007/0122952 A1 May 31, 2007

(30) Foreign Application Priority Data

Nov. 28, 2005 (KR) .................. 10-2005-0114056

(51) Int. Cl.
*H01L 21/8234* (2006.01)
*H01L 21/336* (2006.01)
*H01L 21/20* (2006.01)
*H01L 21/4763* (2006.01)

(52) U.S. Cl. .................. 438/238; 438/294; 438/296; 438/382; 438/637; 438/926; 257/523

(58) Field of Classification Search .................. 438/183, 438/238, 275–278, 382–385, 926, 294, 296, 438/637; 257/523

See application file for complete search history.

(56) References Cited

U.S. PATENT DOCUMENTS

| 5,946,563 | A | * | 8/1999 | Uehara et al. ............... 438/183 |
| 6,514,807 | B1 | * | 2/2003 | Yeh et al. ..................... 438/197 |
| 7,148,540 | B2 | * | 12/2006 | Shibib et al. ................ 257/336 |
| 2004/0198004 | A1 | * | 10/2004 | Tran ........................... 438/289 |
| 2005/0035397 | A1 | * | 2/2005 | Otoi et al. ................... 257/316 |

\* cited by examiner

*Primary Examiner*—Hsien-ming Lee
*Assistant Examiner*—Kevin Parendo
(74) *Attorney, Agent, or Firm*—Sherr & Vaughn, PLLC

(57) ABSTRACT

A dummy gate may be formed over an isolation layer. A sidewall spacer may be formed next to the dummy gate. The dummy gate and the sidewall spacer may substantially cover or completely cover the edge of isolation layer that is adjacent to an active area of a silicon substrate. Damage to the isolation layer due to a contact hole etching may be prevented, even if there are misalignments.

13 Claims, 11 Drawing Sheets

SEMICONDUCTOR DEVICE WITH A DUMMY GATE AND A METHOD OF MANUFACTURING A SEMICONDUCTOR DEVICE WITH A DUMMY GATE

The present application claims priority under 35 U.S.C. 119 and 35 U.S.C. 365 to Korean Patent Application No. 10-2005-0114056 (filed on Nov. 28, 2005), which is hereby incorporated by reference in its entirety.

BACKGROUND

As some areas of semiconductor manufacturing technology have developed, the degree of integration in semiconductor devices has increased. With increases in the degree of integration, semiconductor manufacturing process margins have decreased. For example, misalignments of a metal interconnection contact during a manufacturing process may create complications.

FIGS. 1A to 1C are cross-sectional views which illustrate a structure of a semiconductor device. As illustrated in FIG. 1A, gate oxide layer 12 and gate 13 may be formed over silicon substrate 10. Silicon substrate 10 may have an active area defined by isolation layer 11. An ion implantation process may form a low concentration source/drain 14. Sidewall spacer 15 may be formed by depositing a spacer insulation layer and performing an etching process. An ion implantation process may be implemented, which may use sidewall spacer 15 as a mask, to form a high concentration source/drain 16. Silicide metal may be deposited and heat treated to form silicide layer 17 by a self aligning method.

As illustrated in FIG. 1B, etch stop layer 18 maybe deposited. Interlayer dielectric layer 19 may be deposited. As illustrated in FIG. 1C, interlayer dielectric layer 19 may be selectively etched to form contact hole 20. A metal interconnection contact may be formed in contact hole 20 to connect with silicide layer 17 formed over high concentration source/drain 16.

A process of forming a metal interconnection contact in a highly integrated semiconductor device may be susceptible to misalignments. FIG. 2 illustrates an example of a defect that may occur as a result of a misalignment. As illustrated in FIG. 2, contact hole 20 may overlap isolation layer 11 due to a misalignment. Isolation layer 11 may be vulnerable to an etching process employed to etch contact hole 20, which may cause defect 21. Defect 21 may cause junction leakage. Defect 21 may cause an electrical short between a source/drain and a substrate. Defect 21 may degrade characteristics of a semiconductor device. Defect 21 may reduce the yield of semiconductor device manufacturing.

SUMMARY

Embodiments relate to a semiconductor device having a dummy gate. Embodiments relate to a method of manufacturing a semiconductor device having a dummy gate. Embodiments relate to a semiconductor device having a dummy gate selectively formed over an isolation layer, which may prevent defects from forming at an isolation layer. Embodiments may prevent defects from forming, which are the result of a shortage of process margin during a metal interconnection contact manufacturing process in a highly integrated semiconductor device.

Embodiments relate to a semiconductor device and/or a method of manufacturing a semiconductor device with improved process margins when metal interconnection contacts are formed. In embodiments, characteristics of a semiconductor device may be enhanced. In embodiments, manufacturing yield of semiconductor devices may be improved.

In embodiments, a semiconductor device comprises an isolation layer formed over a silicon substrate, which may define an active area on the silicon substrate. A gate oxide layer and a gate may be formed over an active area of a silicon substrate. A dummy gate may be formed over an isolation layer, in accordance with embodiments. A first sidewall spacer may be formed over a gate. A second sidewall spacer may be formed over a dummy gate.

In accordance with embodiments, a semiconductor device may include a dummy gate that may have at least one pattern. A dummy gate and a second sidewall spacer may substantially or completely cover an upper portion of an isolation layer. A second sidewall spacer may substantially or completely cover the edge of an isolation layer adjacent to an active area.

Embodiments relate to a method of manufacturing a semiconductor device, the method may include at least one of the following steps: forming a gate oxide layer and a gate over a silicon substrate on which an active area is defined by an isolation layer and forming a dummy gate over the isolation layer at the same time; and/or simultaneously forming a first sidewall spacer next to a gate and a second sidewall spacer next to a dummy gate by depositing a spacer insulation layer over the entire surface of a silicon substrate and then etching the entire surface of the silicon substrate. In embodiments, a second sidewall spacer may substantially or completely cover the edge of an isolation layer adjacent to an active area.

BRIEF DESCRIPTION OF DRAWINGS

Example

Example

DETAILED DESCRIPTION

Figure 1A:
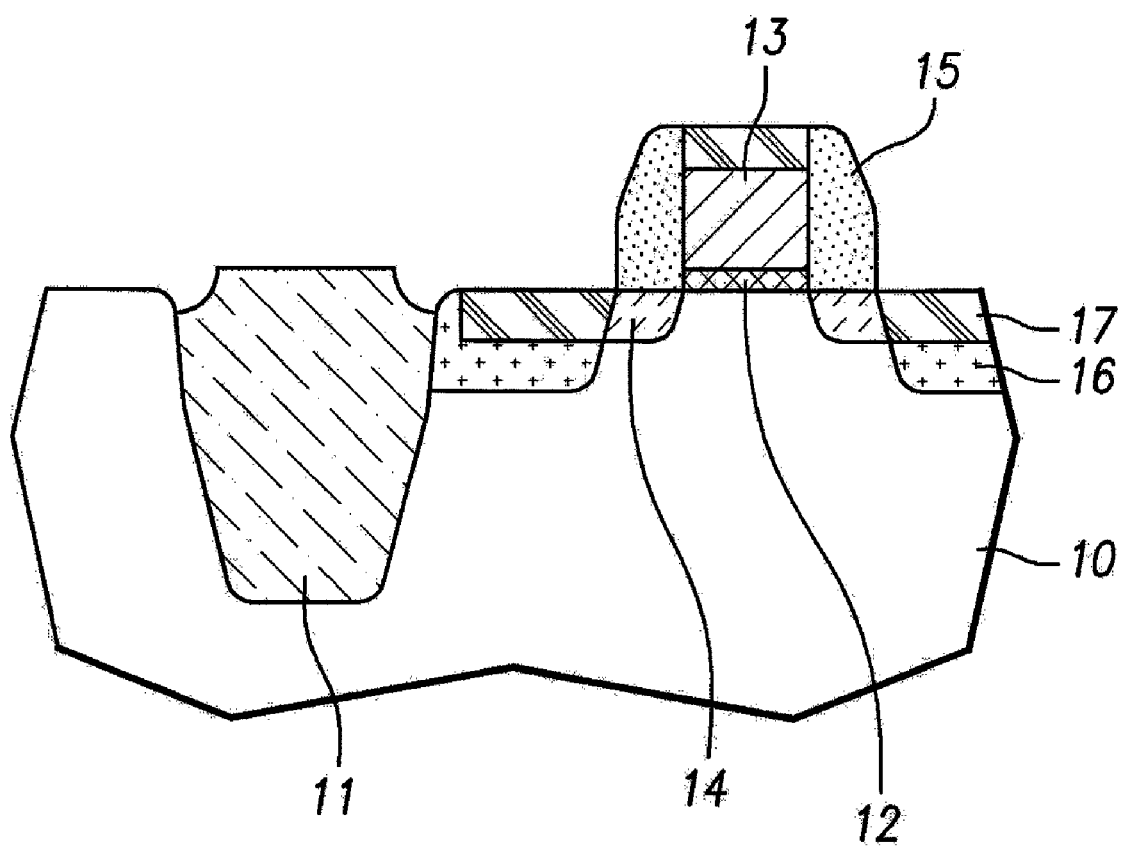
FIGS. 1A to 1C are cross-sectional views illustrating a structure of a semiconductor device and a method of manufacturing a semiconductor device.
Figure 1B:
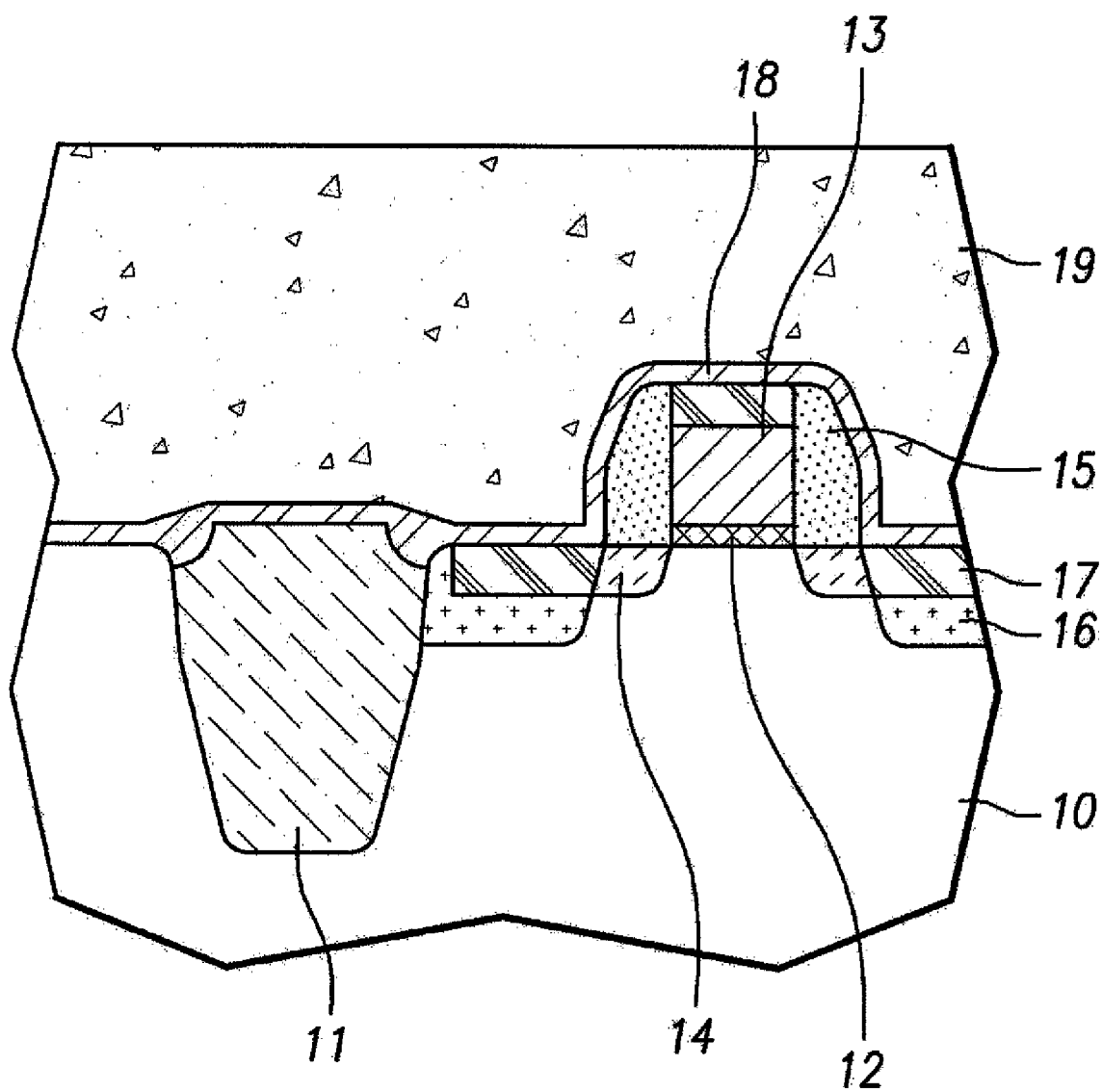
Figure 1C:
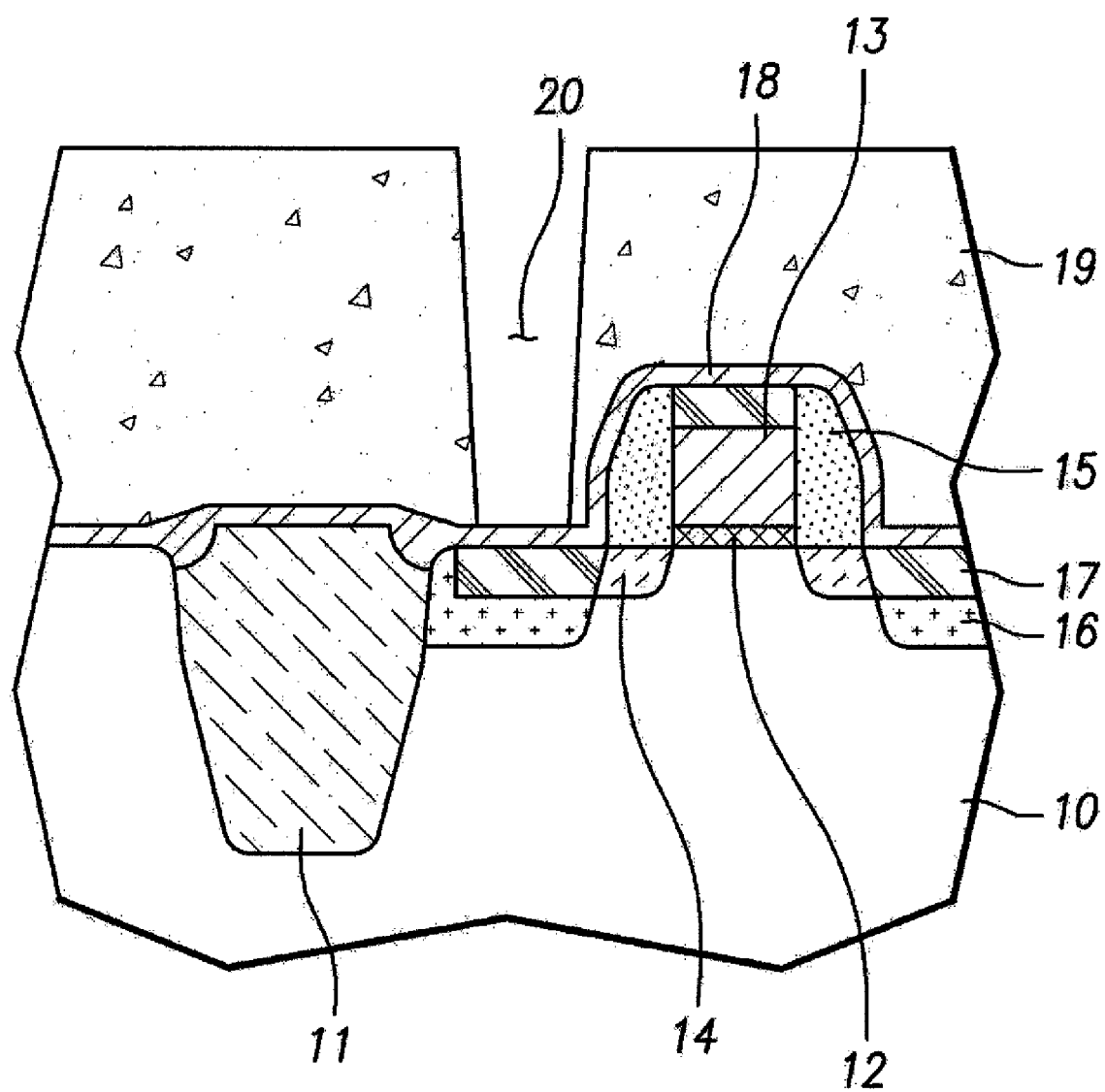
Figure 2:
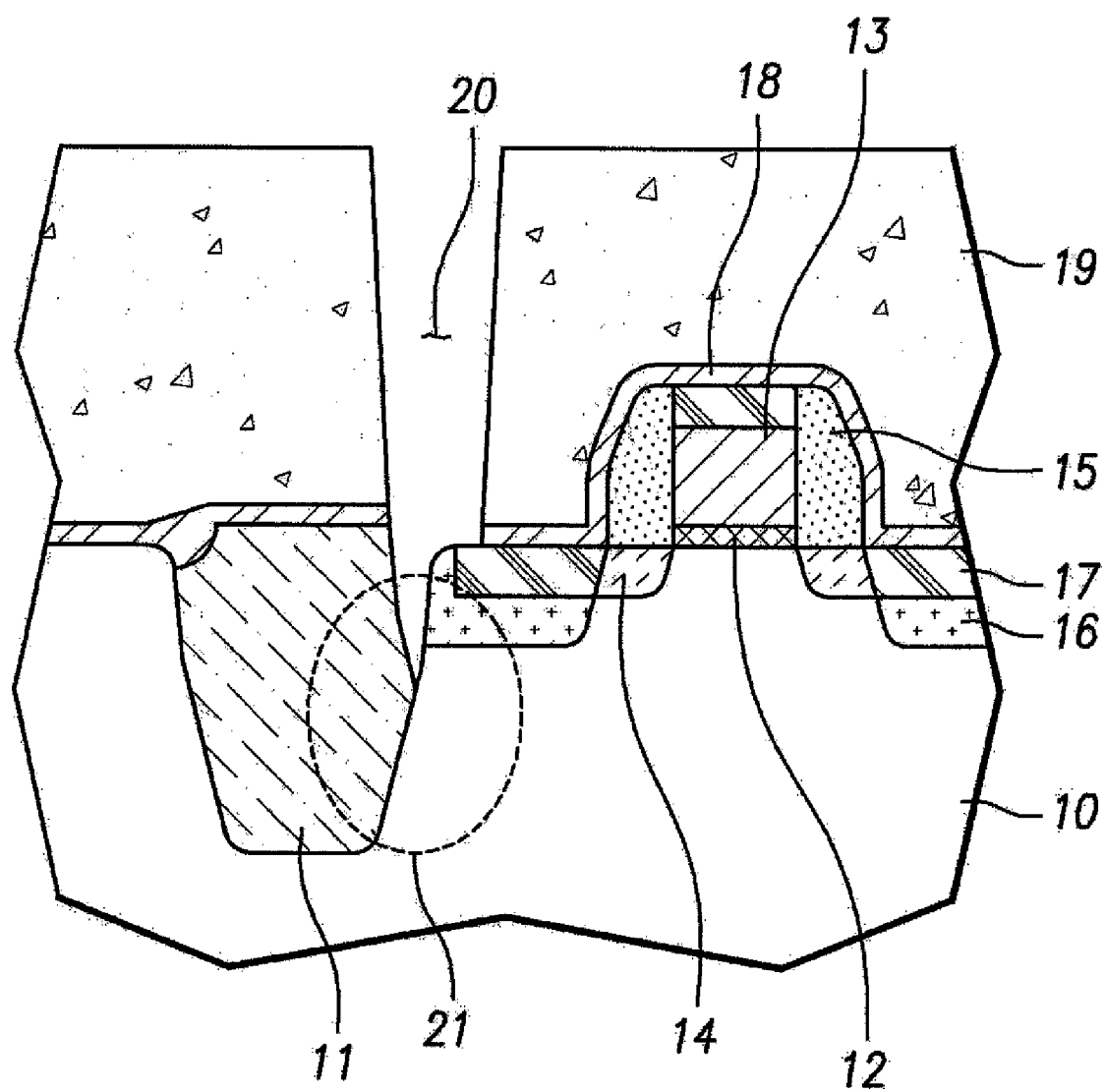
FIG. 2 is a cross-sectional view illustrating an example defect occurring in a semiconductor device.
Figure 3A:
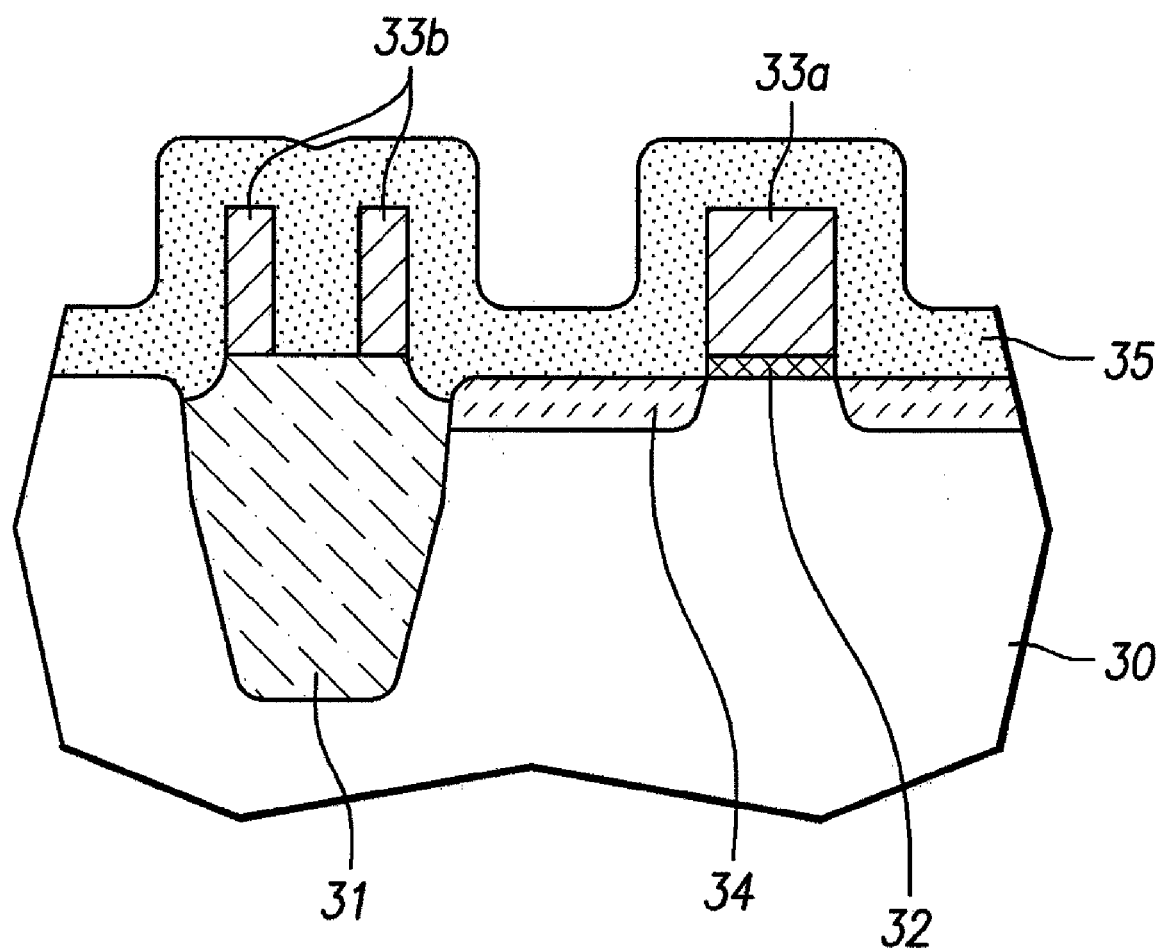
FIGS. 3A to 3F are cross-sectional views illustrating the structure of a semiconductor device, in accordance with embodiments.

Example FIGS. 3A to 3F are cross-sectional views illustrating a structure of a semiconductor device and a method of manufacturing a semiconductor device, according to embodiments. As illustrated in FIG. 3A, gate oxide layer 32 and gate 33a may be formed over silicon substrate 30. Silicon substrate 30 may have an active area defined by isolation layer 31. Dummy gate 33b may be formed over isolation layer 31. Dummy gate 33b may be formed at the same time as gate 33a is formed. The formation of dummy gate 33b and/or gate 33a may be accomplished by changing a mask pattern that forms gate 33a. Dummy gate 33b may not have any electrical function.

Figure 3B:
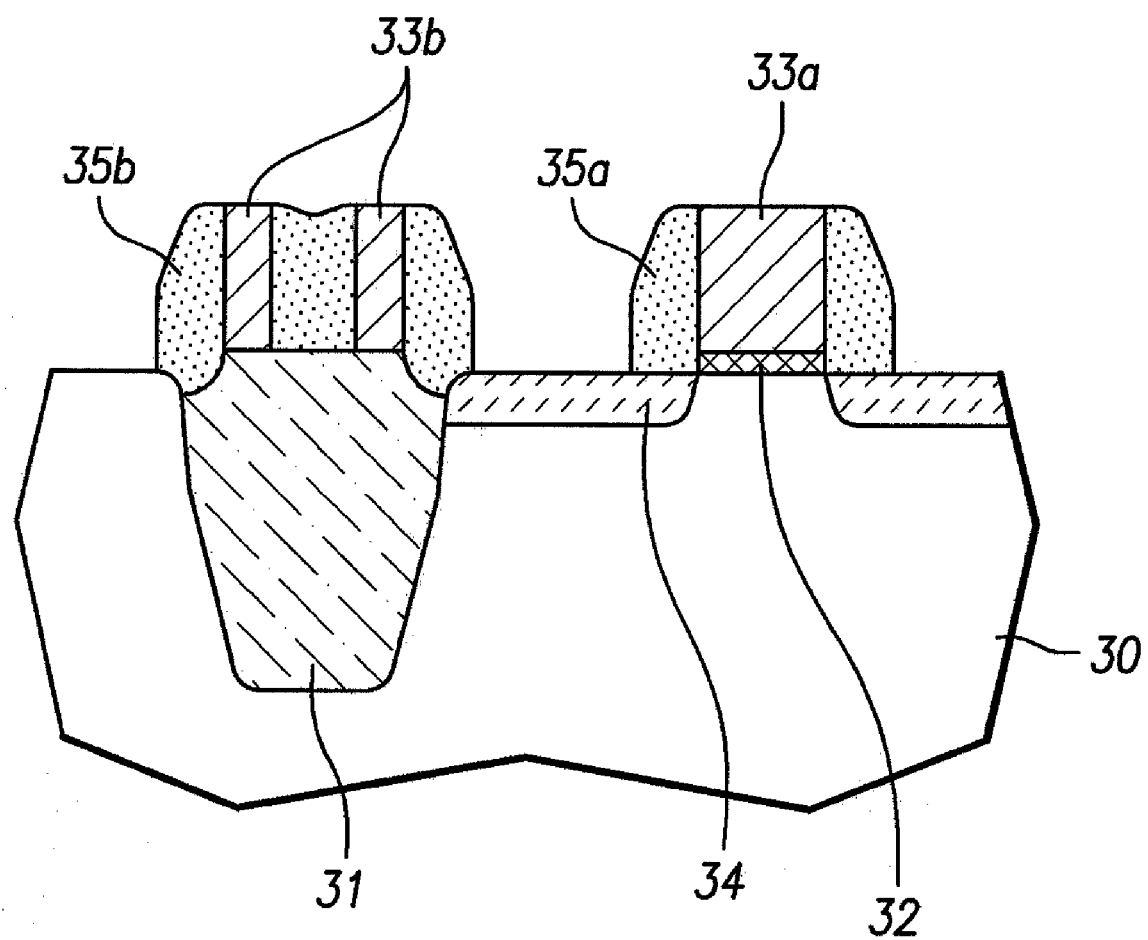

After forming gate 33a and/or dummy gate 33b, ion implantation may be performed to form a low concentration source/drain 34. Spacer insulation layer 35 may be deposited over the entire surface of silicon substrate 30. As illustrated in FIG. 3B, spacer insulation layer 35 may be etched to form sidewall spacer 35a and/or sidewall spacer 35b. First sidewall spacer 35a may be formed next to common gate 33a. Second sidewall spacer 35b may be formed next to dummy gate 33b. Dummy gate 33b and second sidewall spacer 35b may be formed to completely cover or substantially cover the upper portion of isolation layer 31. Second sidewall spacer 35b may be formed to completely cover or substantially cover the edge of isolation layer 31, adjacent to an active area.

Figure 3C:
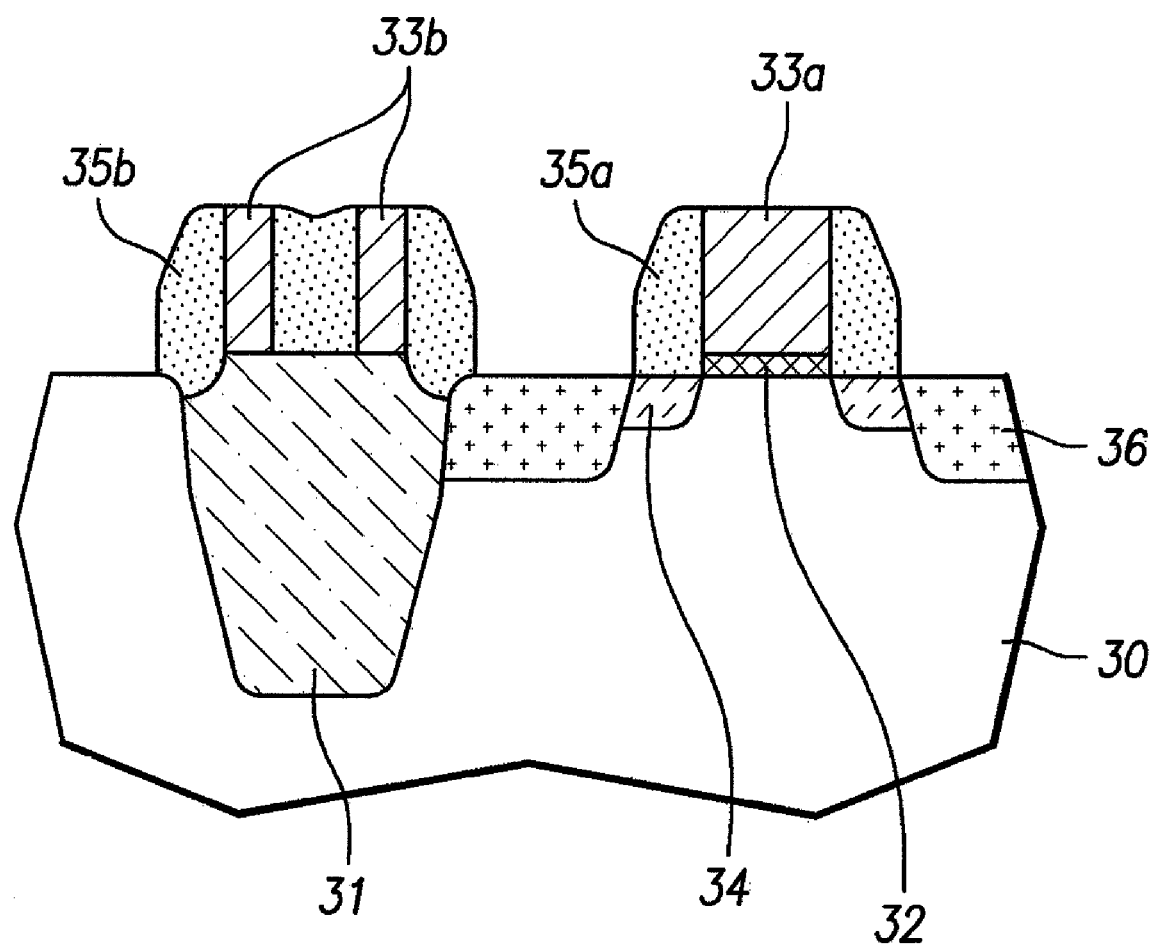

As illustrated in FIG. 3C, an ion implantation process may be implemented. An ion implantation process may use first sidewall spacer 35a and second sidewall spacer 35b as a mask. An ion implantation process may form a high concentration source/drain 36 in an active area of silicon substrate 30.

Figure 3D:
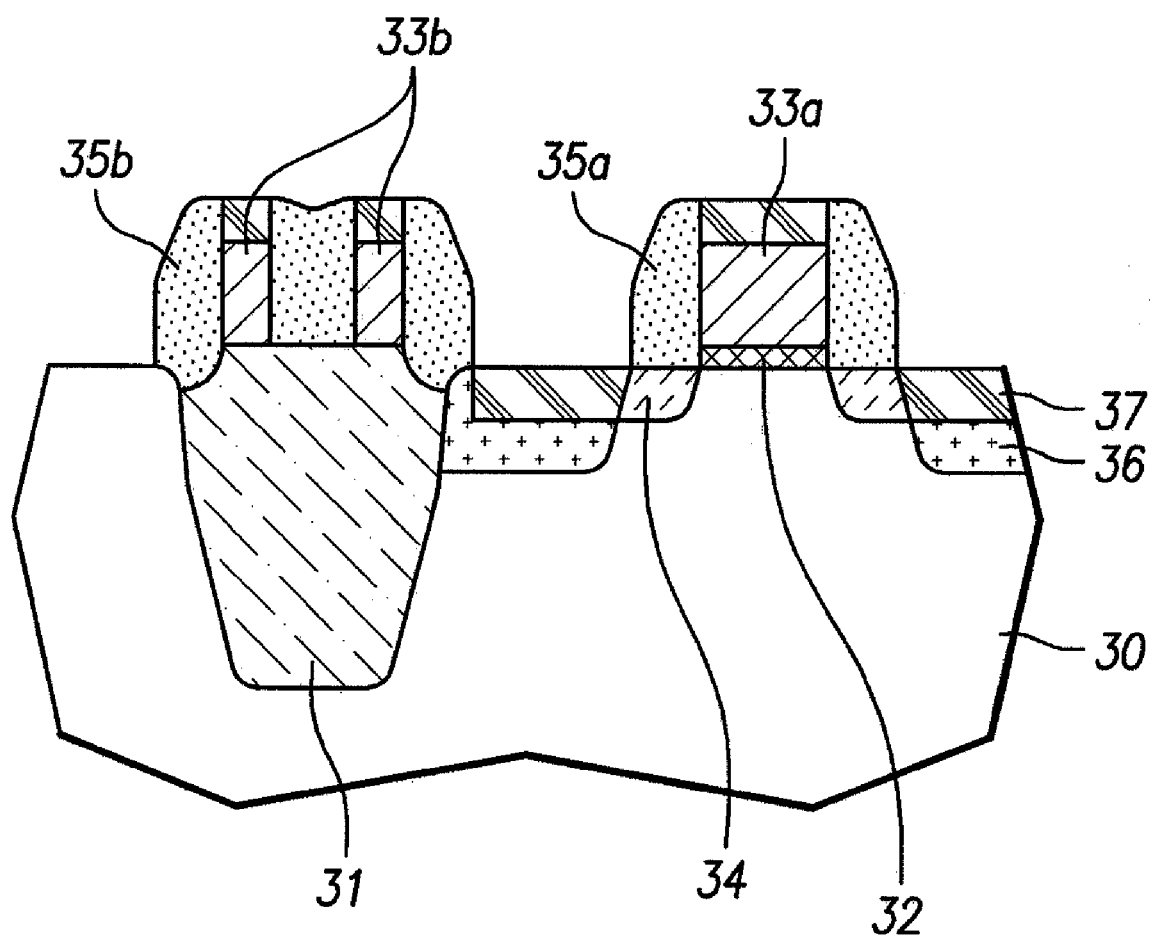

As illustrated in FIG. 3D, silicide metal may be deposited and heat treated to form silicide layer 37, which may be through a self aligning process. Silicide layer 37 may be formed in high concentration source/drain 36, in gate 33a, and/or in dummy gate 33b.

Figure 3E:
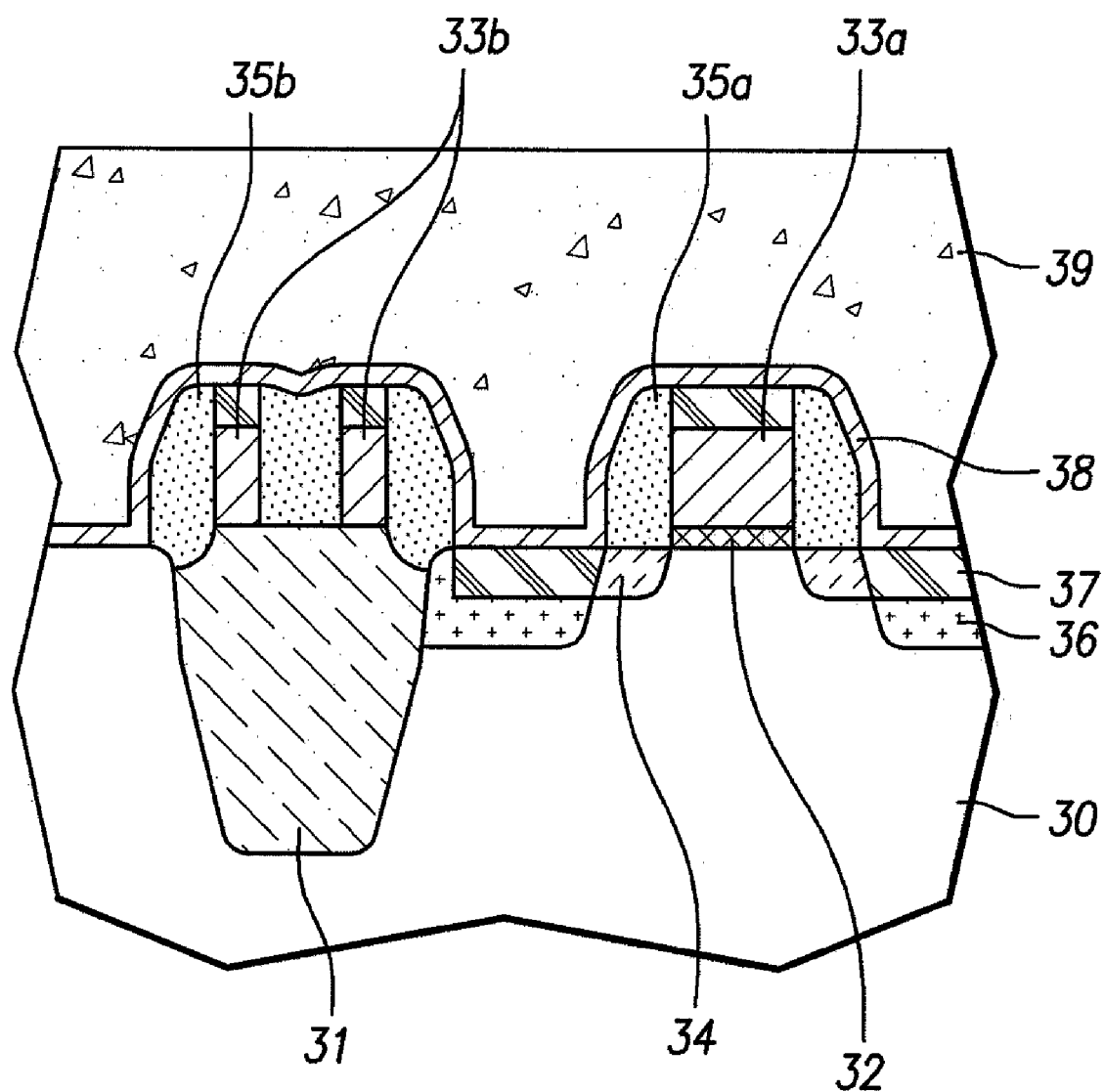
Figure 3F:
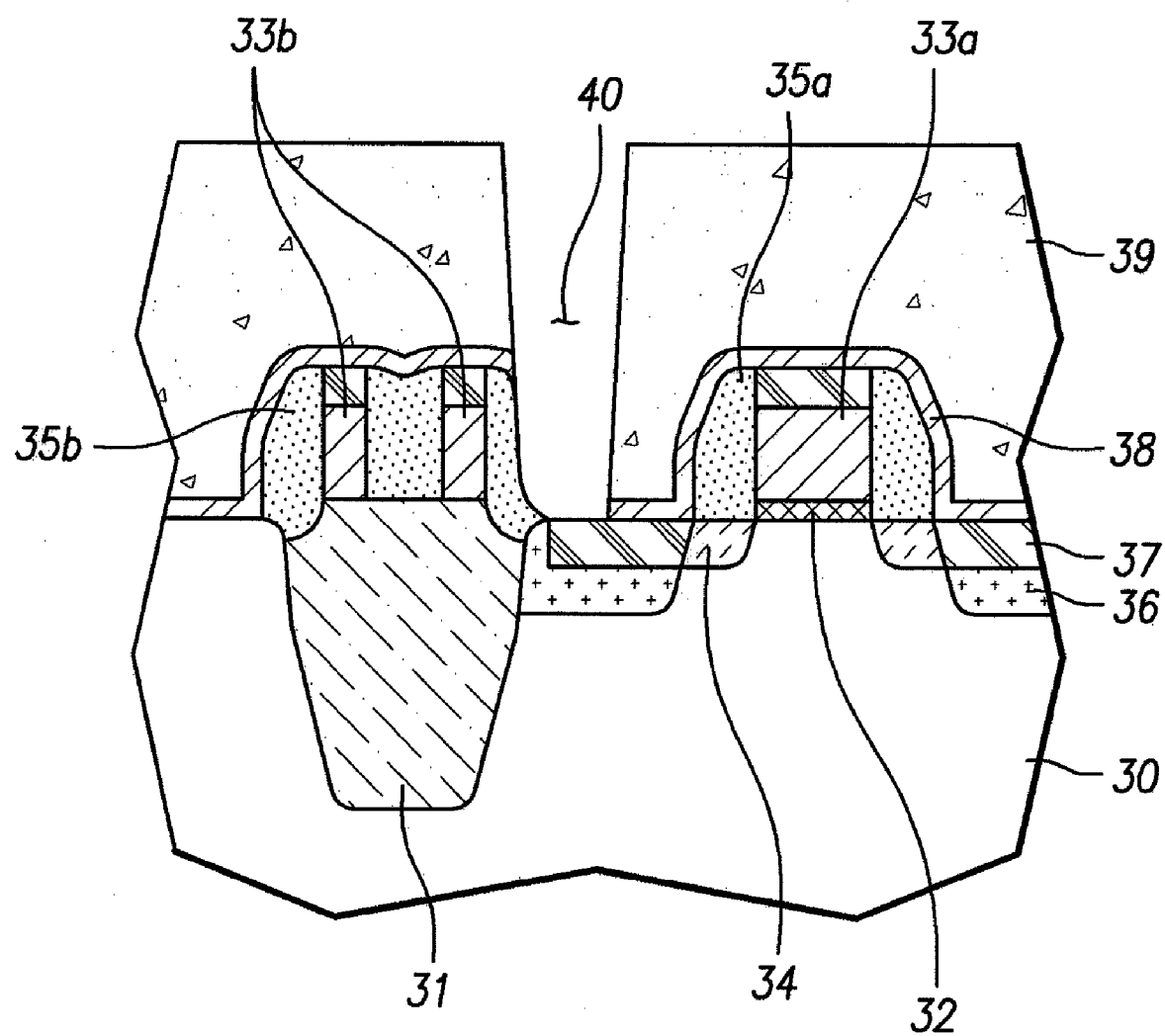

As illustrated in FIG. 3E, etch stop layer 38 maybe deposited. Interlayer dielectric layer 39 may be deposited. As illustrated in FIG. 3F, interlayer dielectric layer 39 may be selectively etched to form contact hole 40. A metal interconnection contact may be formed in contact hole 40 to connect with silicide layer 37.

Even though contact hole 40 and isolation layer 31 may overlap (e.g. due to a misalignment occurring during the process of forming contact hole 40), isolation layer 31 may be undamaged during etching of contact hole 40. Isolation layer 31 may be undamaged because dummy gate 33b and/or second sidewall spacer 35b may be formed over isolation layer 31. Dummy gate 33b may protect isolation layer 31 during formation of a metal interconnection contact. Dummy gate 33b may be selectively formed on only a portion of an isolation layer, according to embodiments, to compensate for process margin. In embodiments illustrated in FIGS. 3A through 3F, two separated dummy gates 33b may be formed over isolation layer 31.

Figure 4:
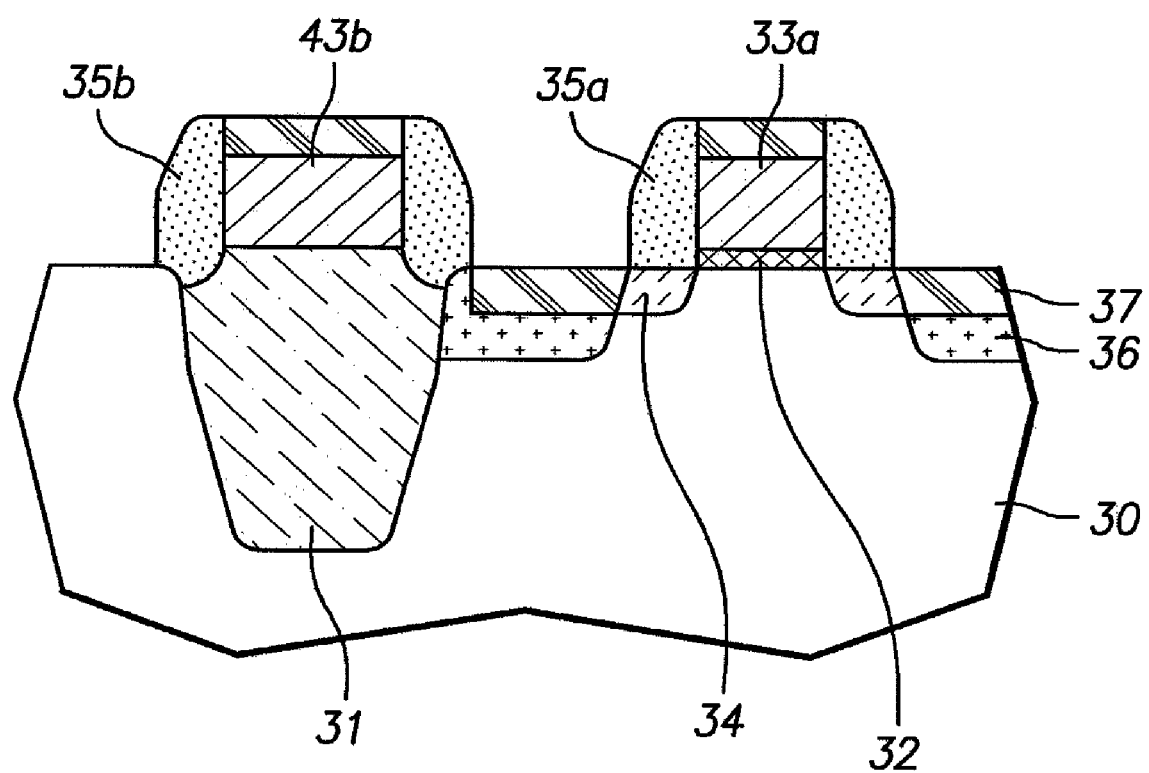
FIG. 4 is a cross-sectional view illustrating the structure of a semiconductor device, according to embodiments.

FIG. 4 is a cross-sectional view illustrating a structure of a semiconductor device, according to embodiments. Patterned dummy gate 43b may be formed, according to embodiments. The pattern shape of dummy gate 33b and dummy gate 43b may improve process margin and/or may protect isolation layer 31 during formation of a metal interconnection contact, according to embodiments.

In accordance with embodiments, a dummy gate may be simultaneously formed with a common gate. A second sidewall spacer may be simultaneously formed next to a dummy gate with a first sidewall spacer of a gate. In embodiments, a dummy gate and a second sidewall spacer may completely cover or substantially cover an upper portion of an isolation layer, which may protect the isolation layer. In embodiments, an edge of an isolation layer (e.g. adjacent to an active area) maybe prevented from being damaged during etching of a contact hole, even if some misalignments are present. In embodiments, a process margin of a metal interconnection contact process may be improved. In embodiments, characteristics and/or yield of a semiconductor device may be improved.

A dummy gate may provide no electrical function and may serve to protect an isolation layer during formation of a metal interconnection contact, in accordance with embodiments. In embodiments, a dummy gate may not be formed over every isolation layer and may be selectively formed in areas having insufficient process margin. Additional apparatuses or processes of forming a dummy gate may not be necessary, in some embodiments.

It will be apparent to those skilled in the art that various modifications and variations can be made to embodiments. Thus, it is intended that embodiments cover modifications and variations thereof within the scope of the appended claims.

What is claimed:

1. A semiconductor device comprising:
    an isolation layer formed in a silicon substrate;
    a dummy gate formed over and contacting the isolation layer, wherein the dummy gate includes a pair of dummy gate patterns formed spaced apart over the isolation layer;
    a first sidewall spacer formed on the isolation layer between and contacting inner sides of the dummy gate patterns and filling the space between the dummy gate patterns;
    a second sidewall spacer formed on the isolation layer and an outer side of one of the dummy pate patterns; and
    a third sidewall spacer formed on the isolation layer and an outer side of the other one of the dummy pate patterns,
    wherein the dummy gate patterns and the sidewall spacers combine to cover the entire upper surface of the isolation layer.

2. The semiconductor device of claim 1, wherein the isolation layer defines an active area of the silicon substrate.

3. The semiconductor device of claim 1, wherein:
    a gate oxide layer and a gate are formed over an active area of the silicon substrate; and
    a fourth sidewall spacer is formed next to the gate.

4. The semiconductor device of claim 1, further comprising a first suicide layer formed on the uppermost surface of one of the dummy gate patterns and a second silicide layer formed on an the uppermost surface of the other one of the dummy pate patterns, wherein the first, second, and third sidewall spacers contact sides of the first silicide layer and the second silicide layer.

5. The semiconductor device of claim 1, wherein the third sidewall spacer covers an edge of the isolation layer that is adjacent to the active area.

6. The semiconductor device of claim 1, further comprising a silicide layer formed on each of the dummy pate patterns, wherein the first, second, and third sidewall spacers contact sides of each suicide layer.

7. A method of manufacturing a semiconductor device comprising:
    forming an isolation layer defining an active area in a silicon substrate;
    forming a gate over the silicon substrate; and
    forming a dummy gate over the isolation layer of the silicon substrate, wherein the dummy gate includes a pair of dummy gate patterns formed spaced apart over the silicon substrate; and
    simultaneously forming first, second and third sidewall spacers on and contacting both sides of the dummy gate patterns including filling the space between the dummy gate patterns,
    wherein the dummy gate patterns and the sidewall spacers combine to cover the entire upper surface of the isolation layer.

8. The method of claim 7, wherein the gate and the dummy gate are formed simultaneously.

9. The method of claim 7, comprising forming a gate oxide layer over the silicon substrate.

10. The method of claim 7, wherein the first, second, and third sidewall spacers are formed by depositing a spacer insulation layer over an entire surface of the silicon substrate and selectively etching the spacer insulation layer.

11. The method of claim 7, wherein the third sidewall spacer covers an edge of the isolation layer that is adjacent to the active area.

12. The method of claim 11, further comprising forming a silicide layer on each of the dummy gate patterns, wherein the first, second, and third sidewall spacers contact sides of each silicide layer.

13. A semiconductor device comprising:
an isolation layer formed in a silicon substrate;
a dummy gate including first and second dummy gate patterns formed spaced apart over and contacting the isolation layer;
a first sidewall spacer formed on and contacting a side of the first dummy gate pattern;
a second sidewall spacer formed on and contacting a side of the second dummy gate pattern; and
a third sidewall spacer formed in the space between the dummy gate patterns and contacting sides of the dummy gate patterns not contacted by the first and second sidewall spacers.

* * * * *